US012693316B2

(12) United States Patent
Masago

(10) Patent No.: US 12,693,316 B2
(45) Date of Patent: Jul. 28, 2026

(54) CURRENT SENSOR

(71) Applicant: Rohm Co., Ltd., Kyoto (JP)

(72) Inventor: Kenichi Masago, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 251 days.

(21) Appl. No.: 18/397,828

(22) Filed: Dec. 27, 2023

(65) Prior Publication Data

US 2024/0125823 A1 Apr. 18, 2024

Related U.S. Application Data

(63) Continuation of application No. PCT/JP2022/017357, filed on Apr. 8, 2022.

(30) Foreign Application Priority Data

Jul. 5, 2021 (JP) .................................. 2021-111297

(51) Int. Cl.
*G01R 19/00* (2006.01)
*H03F 3/45* (2006.01)
*H03K 17/06* (2006.01)
(52) U.S. Cl.
CPC ....... *G01R 19/0092* (2013.01); *H03F 3/4521* (2013.01); *H03K 17/063* (2013.01); *H03F 2200/261* (2013.01)
(58) Field of Classification Search
CPC .... G01R 19/0092; G01R 19/18; G01R 1/203; H03F 3/4521; H03F 2200/261; H03K 17/063; H03K 19/0175
See application file for complete search history.

(56) References Cited

U.S. PATENT DOCUMENTS

2009/0108833 A1* 4/2009 Ziegler ................ G01R 15/185
324/117 R
2021/0349131 A1* 11/2021 Vorndran ............. G01R 15/207

FOREIGN PATENT DOCUMENTS

JP 2000-231940 8/2000
JP 2002-311065 10/2002
JP 2004-173353 6/2004
JP 2004-309386 11/2004

OTHER PUBLICATIONS

International Search Report and Written Opinion in International Appln. No. PCT/JP2022/017357, mailed on Jun. 21, 2022, 15 pages (with machine translation).
JP OA—Japanese Patent Office, Office Action in Japanese Appln. No. 2023-533442, dated Nov. 11, 2025, 5 pages (with English Translation).

* cited by examiner

*Primary Examiner* — Paresh Patel
(74) *Attorney, Agent, or Firm* — Fish & Richardson P.C.

(57) ABSTRACT

A current sensor includes: a first and a second input terminal configured to be capable of having a sense resistor connected therebetween; a square wave generation circuit connected to the first and second input terminals and configured to be capable of generating a square-wave signal with an amplitude proportional to the voltage across the sense resistor; and a current sense signal output circuit configured to be capable of outputting based on the square-wave signal a current sense signal corresponding to the current passing through the sense resistor.

5 Claims, 7 Drawing Sheets

CURRENT SENSOR

CROSS-REFERENCE TO RELATED APPLICATIONS

This nonprovisional application is a continuation application of International Patent Application No. PCT/JP2022/017357 filed on Apr. 8, 2022, which claims priority Japanese Patent Application No. 2021-111297 filed on Jul. 5, 2021, the entire contents of which are hereby incorporated by reference.

TECHNICAL FIELD

The present disclosure relates to current sensors.

BACKGROUND ART

Some known current sensors sense a current that passes across a sense resistor (shunt resistor) and outputs a current sense signal that indicates the result of the sensing.

CITATION LIST

Patent Literature

Patent Document 1: JP-A-2004-173353

DESCRIPTION OF EMBODIMENTS

Figure 1:
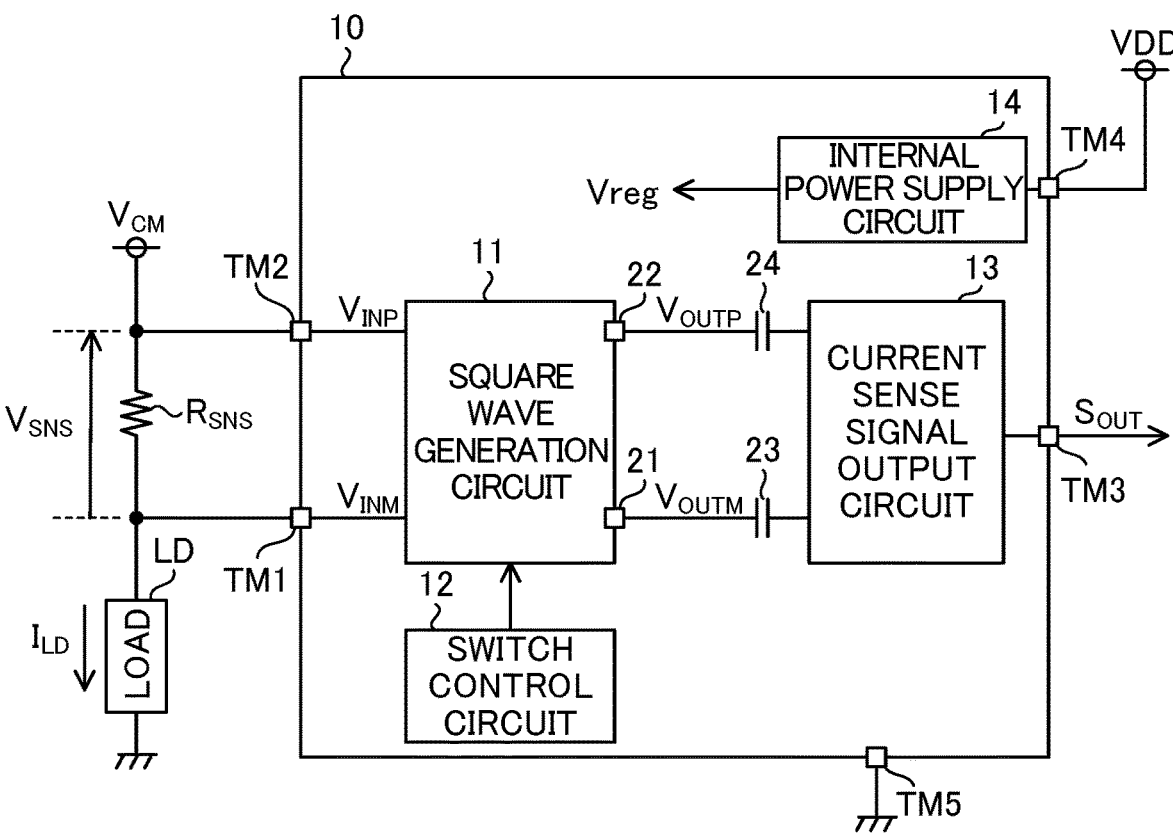
FIG. 1 is a schematic configuration diagram of a current sensor according to an embodiment of the present disclosure.

Hereinafter, examples of implementing the present disclosure will be described specifically with reference to the accompanying drawings. Among the diagrams referred to in the course, the same parts are identified by the same reference signs, and in principle no overlapping description of the same parts will be repeated. In the present description, for the sake of simplicity, symbols and reference signs referring to information, signals, physical quantities, elements, parts, and the like are occasionally used with omission or abbreviation of the names of the information, signals, physical quantities, elements, parts, and the like corresponding to those symbols and reference signs. For example, the current sense signal output circuit described later and identified by the reference sign "13" (see FIG. 1) is sometimes referred to as "current sense signal output circuit 13" and other times abbreviated to "circuit 13", both referring to the same entity.

First, some of the terms used to describe embodiments of the present disclosure will be defined. "Line" denotes a wiring across or to which an electrical signal is passed or applied. "Ground" denotes a reference conductor at a reference potential of 0 V (zero volts), or to a potential of 0 V itself. A reference conductor is formed of an electrically conductive material such as metal. A potential of 0 V is occasionally referred to as a ground potential. In embodiments of the present disclosure, any voltage mentioned with no particular reference mentioned is a potential relative to the ground.

"Level" denotes the level of a potential, and for any signal or voltage of interest, "high level" is a potential higher than "low level". For any signal or voltage of interest, its being at high level means, more precisely, its level being equal to high level, and its being at low level means, more precisely, its level being equal to low level. A level with respect to a signal is occasionally referred to as a signal level, and a level with respect to a voltage is occasionally referred to as a voltage level. For any signal of interest, when the signal is at high level, the inversion signal of that signal is at low level; when the signal is at low level, the inversion signal of that signal is at high level. For any signal or voltage of interest, a transition from low level to high level is termed an up edge (or rising edge), and a transition from high level to low level is termed a down edge (or falling edge).

For any transistor configured as an FET (field-effect transistor), which can be a MOSFET, "on state" refers to a state where the drain-source channel of the transistor is conducting, and "off state" refers to a state where the drain-source channel of the transistor is not conducting (cut off). Similar definitions apply to any transistor that is not classified as an FET. Unless otherwise stated, any MOSFET can be understood to be an enhancement MOSFET. "MOSFET" is an abbreviation of "metal-oxide-semiconductor field-effect transistor". Unless otherwise stated, for any MOSFET, its back gate can be understood to be short-circuited to its source.

Any switch can be configured with one or more FETs (field-effect transistors). When a given switch is in the on state, the switch conducts across its terminals; when a given switch is in the off state, the switch does not conduct across its terminals. For any transistor or switch, its being in the on or off state is occasionally expressed simply as its being on or off respectively. For any transistor or switch, a transition from the off state to the on state is referred to as a turning-on, and a transition from the on state to the off state is referred to as a turning-off.

For any transistor or switch, a period in which it is in the on state is often referred to as the on period, and a period in which it is in the off state is often referred to as the off period. For any signal that takes as its signal level high level or low level, the period in which the signal is at high level is referred to as the high-level period and the period in which the signal is at low level is referred to as the low-level period. The same applies to any voltage that takes as its voltage level high level or low level.

Unless otherwise stated, wherever "connection" is discussed among a plurality of parts constituting a circuit, as among given circuit elements, wirings (conductors), nodes, and the like, the term is to be understood to denote "electrical connection".

FIG. 1 is a schematic configuration diagram of a current sensor 10 according to an embodiment of the present disclosure. The current sensor 10 includes terminals TM1 to TM5, and also includes a square wave generation circuit 11, a switch control circuit 12, a current sense signal output circuit 13, an internal power supply circuit 14, terminals 21 and 22, and capacitors 23 and 24. The terminals TM1 to TM5 correspond to external terminals and the terminals 21 and 22 correspond to internal terminals.

The current sensor 10 is a semiconductor device (electronic component) that includes a semiconductor chip having a semiconductor integrated circuit formed on a semiconductor substrate, a package (case) that houses the semiconductor chip, and a plurality of external terminals exposed out of the package to outside the current sensor 10. Sealing a semiconductor chip in a package (case) formed of resin yields a semiconductor device. The circuits and circuit elements that constitute the current sensor 10, including the circuits 11 to 14 and the capacitors 23 and 24, are included in the semiconductor integrated circuit. While only the terminals TM1 to TM5 are shown in FIG. 1 as external terminals provided in the current sensor 10, the current sensor 10 may be provided with any other external terminals.

Outside the current sensor 10, a sense resistor $R_{SNS}$ is provided. One terminal of the sense resistor $R_{SNS}$ is connected to the terminal TM1, and the other terminal of the sense resistor $R_{SNS}$ is connected to the terminal TM2. The connection node between the terminal TM2 and the sense resistor $R_{SNS}$ is connected to a terminal to which a positive voltage $V_{CM}$ is applied, and thus the terminal TM2 is fed with the voltage $V_{CM}$. In the following description, the voltage $V_{CM}$ is occasionally referred to as the common-mode (in-phase) voltage.

The connection node between the terminal TM1 and the sense resistor $R_{SNS}$ is connected to one terminal of a load LD. The other terminal of the load LD is connected to a ground. From a terminal to which the common-mode voltage $V_{CM}$ is applied, a current $I_{LD}$ passes via the sense resistor $R_{SNS}$ through the load LD. This produces, across the sense resistor $R_{SNS}$, a voltage drop based on the current $I_{LD}$. The voltage drop across the sense resistor $R_{SNS}$ will be referred to as the sense voltage $V_{SNS}$. The terminal TM1 is fed with a voltage ($V_{CM}$-$V_{SNS}$) lower than the common-mode voltage $V_{CM}$ by the sense voltage $V_{SNS}$. In the following description, the voltage at the terminal TM1 is occasionally identified by the symbol "$V_{CM}$", and the voltage at the terminal TM2 is occasionally identified by the symbol "$V_{INP}$".

From the terminal TM3, a current sense signal Sour, which will be described later, is output. The terminal TM4 is supplied with a supply voltage VDD. The supply voltage VDD has a positive direct-current voltage value within a predetermined voltage range. The terminal TM5 is connected to the ground.

The square wave generation circuit 11 is connected to the terminals TM1 and TM2. The square wave generation circuit 11 includes a plurality of switches, and generates, based on the voltages $V_{INP}$ and $V_{INM}$, a square-wave signal with an amplitude proportional to the voltage across the sense resistor $R_{SNS}$ (i.e., the sense voltage $V_{SNS}$). Using the plurality of switches just mentioned, the square wave generation circuit 11 outputs the square-wave signal via the terminals 21 and 22 (details will be given later). The terminals 21 and 22 corresponds to the output terminals of the square wave generation circuit 11. The voltages appearing at the terminals 21 and 22 will be identified by the symbols "$V_{OUTM}$" and "$V_{OUTP}$" respectively.

The switch control circuit 12 controls the states (on/off states) of the switches in the square wave generation circuit 11.

Based on the square-wave signal output from the square wave generation circuit 11, the current sense signal output circuit 13 generates a current sense signal Sour corresponding to the current $I_{LD}$ passing through the sense resistor $R_{SNS}$, and outputs the current sense signal Sour via the terminal TM3 toward a circuit (not illustrated) external to the current sensor 10. Based on the current sense signal Sour, the external circuit can recognize the value of the current $I_{LD}$. For example, the current sense signal Sour is an analog signal that has a voltage value proportional to the current $I_{LD}$. For another example, the current sense signal Sour can be a digital signal that indicates the value of the current $I_{LD}$. Between the terminal 21 and the circuit 13, the capacitor 23 is inserted and, between the terminal 22 and the circuit 13, the capacitor 24 is inserted. Thus, the alternating-current components of both of the voltages $V_{OUTM}$ and $V_{OUTP}$ are fed to the current sense signal output circuit 13.

The internal power supply circuit 14 generates one or more internal supply voltages based on the supply voltage VDD supplied to the terminal TM4. The circuits in the current sensor 10 can operate by using the internal supply voltages generated by the internal power supply circuit 14. FIG. 1 shows an internal supply voltage Vreg as an example of an internal supply voltage generate by the internal power supply circuit 14. The internal supply voltage Vreg has a predetermined positive direct-current voltage value.

Figure 2:
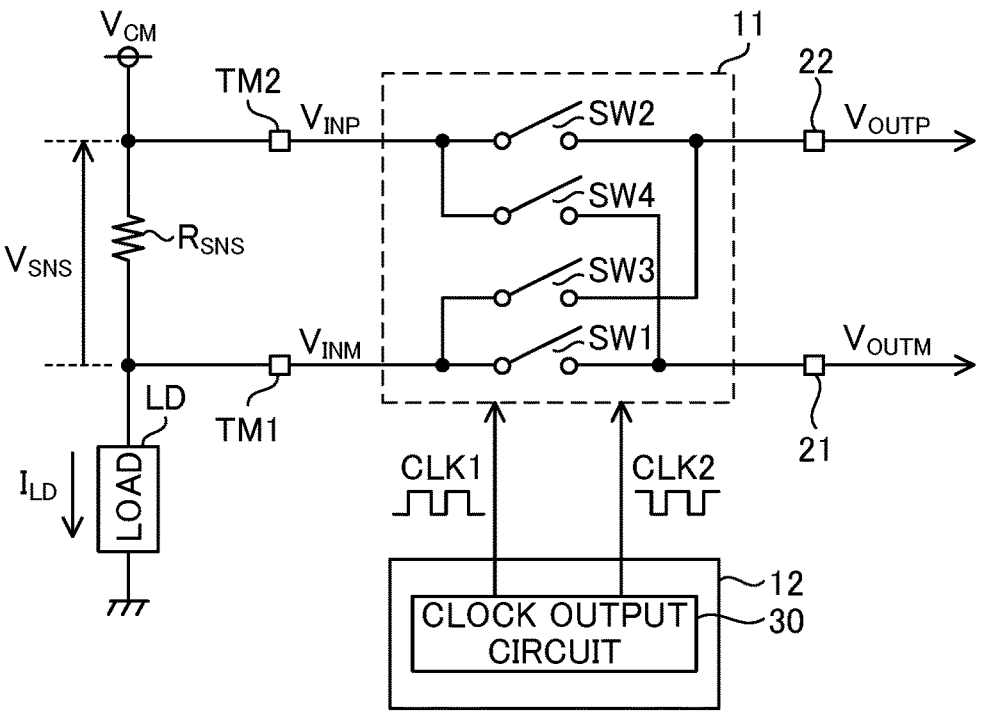
FIG. 2 is a configuration diagram of part of the current sensor in FIG. 1.

FIG. 2 shows the internal configuration of the square wave generation circuit 11. The square wave generation circuit 11 includes switches SW1 to SW4. The first and second terminals of the switch SW1 are connected to the terminals TM1 and 21 respectively. The first and second terminals of the switch SW2 are connected to the terminals TM2 and 22 respectively. The first and second terminals of the switch SW3 are connected to the terminals TM1 and 22 respectively. The first and second terminals of the switch SW4 are connected to the terminals TM2 and 21 respectively.

The switch control circuit 12 includes a clock output circuit 30. The clock output circuit 30 generates and outputs clock signals CLK1 and CLK2. The clock signals CLK1 and CLK2 are rectangular-wave signals with a predetermined frequency and a predetermined amplitude. The clock signals CLK1 and CLK2 have equal frequencies and equal amplitudes, but have phases shifted by 180° from each other. That is, the clock signal CLK2 corresponds to an inversion signal of the clock signal CLK1 (in other words, the clock signal CLK1 corresponds to an inversion signal of the clock signal CLK2). The clock signals CLK1 and CLK2 are fed to the square wave generation circuit 11. The states (on/off states) of the switches SW1 to SW4 are controlled individually based on the clock signals CLK1 and CLK2.

Figure 3:
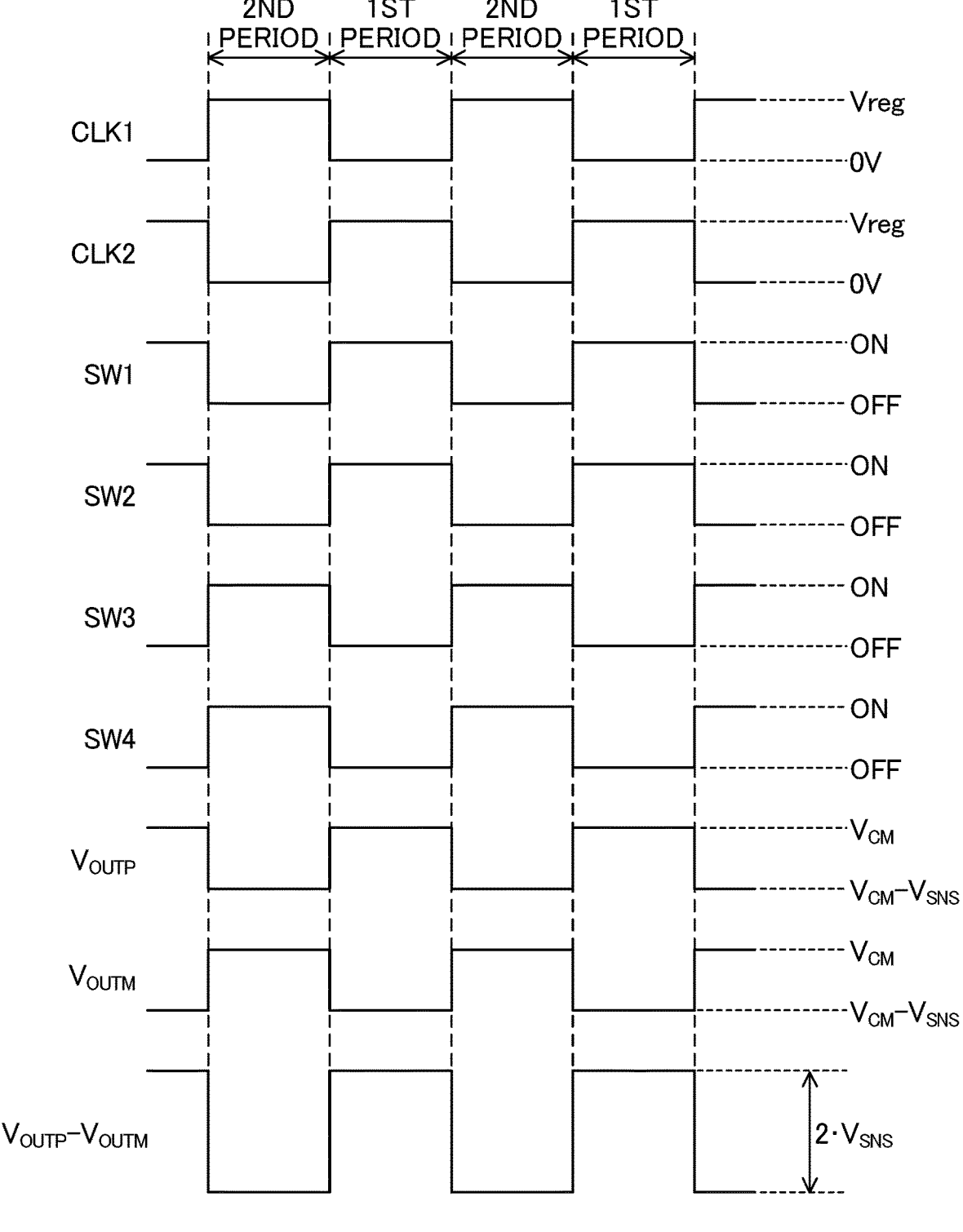
FIG. 3 is a timing chart showing the relationship among two clock signals, the states of four switches, etc. in the configuration in FIG. 2.

FIG. 3 is a timing chart showing the relationship among the clock signals CLK1 and CLK2 and the states of the switches SW1 to SW4. The clock signals CLK1 and CLK2 each take, as its signal level, high or low level alternately. It should however be noted that, when the clock signal CLK1 is at high level, the clock signal CLK2 is at low level and that, when the clock signal CLK1 is at low level, the clock signal CLK2 is at high level. The clock signals CLK1 and CLK2 can each have any duty. With respect to the signal levels of the clock signals CLK1 and CLK2, low level is an example of a first level and high level is an example of a second level.

With respect to each of the clock signals CLK1 and CLK2, it is assumed that high level is the potential of the voltage Vreg and that low level is the potential of 0 V. The voltage Vreg is, for example, four volts. While in practice the sense voltage $V_{SNS}$ can be constantly changing according to the current $I_{LD}$, in FIG. 3 the sense voltage $V_{SNS}$ is assumed to be constant. Also in the other diagrams referred to later and in the following description, the sense voltage $V_{SNS}$ is assumed to be constant unless otherwise required.

The period in which the clock signal CLK1 is at low level will be referred to as the first period. The low-level period of the clock signal CLK1 coincides with the high-level period of the clock signal CLK2. The high-level period of the clock signal CLK1 will be referred to as the second period. The high-level period of the clock signal CLK1 coincides with the low-level period of the clock signal CLK2. Once the current sensor 10 starts to be supplied with the supply voltage VDD and goes through predetermined start-up operation, the first and second periods occur alternately.

Figure 4:
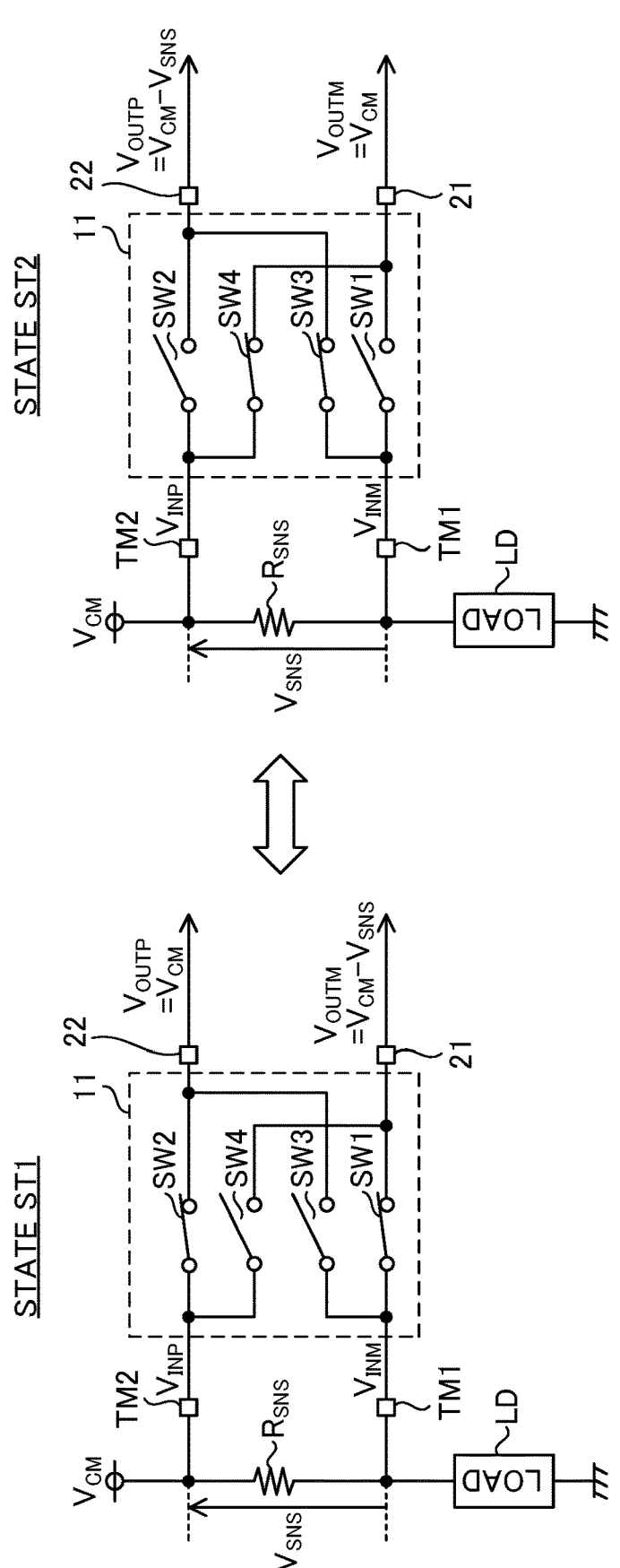
FIG. 4 is a diagram showing the states of the switches in the configuration in FIG. 2.

FIG. 4 shows the two states that the square wave generation circuit 11 can take, namely state ST1 (a first state) and state ST2 (a second state). In the first period, the square wave generation circuit 11 is in state ST1 and, in the second period, the square wave generation circuit 11 is in state ST2. In state ST1 (hence in the first period), the switches SW1 and SW2 are on and the switches SW3 and SW4 are off. In state ST2 (hence in the second period), the switches SW1 and SW2 are off and the switches SW3 and SW4 are on. Thus, by outputting the clock signals CLK1 and CLK2, the switch control circuit 12 switches the state of the square wave generation circuit 11 (in other words, the states of the switches SW1 to SW4) alternately between states ST1 and ST2.

In the first state, the voltage at the terminal TM1 is applied to the terminal 21 and the voltage at the terminal TM2 is applied to the terminal 22. Accordingly, in the first state, $V_{OUTP}=V_{INP}=V_{CM}$ and $V_{OUTM}=V_{INM}=V_{CM}-V_{SNS}$. In the second state, the voltage at the terminal TM1 is applied to the terminal 22 and the voltage at the terminal TM2 is applied to the terminal 21. Accordingly, in the second state, $V_{OUTP}=V_{INM}=V_{CM}-V_{SNS}$ and $V_{OUTM}=V_{INP}=V_{CM}$.

The voltages $V_{OUTP}$ and $V_{OUTM}$ are each a pulsating voltage having a rectangular waveform with an amplitude of $V_{SNS}/2$. The voltages $V_{OUTP}$ and $V_{OUTM}$ however have phases shifted by 180° from each other. Thus, between the terminals 21 and 22 appears a square-wave signal that corresponds to their differential voltage ($V_{OUTP}-V_{OUTM}$). The square-wave signal as the differential voltage ($V_{OUTP}-V_{OUTM}$) is a rectangular-wave signal with an amplitude of Vs N s. Based on the square-wave signal corresponding to the differential voltage ($V_{OUTP}-V_{OUTM}$), the current sense signal output circuit 13 can, by extracting information on the sense voltage VS N S from the square-wave signal, generate the current sense signal $S_{OUT}$ corresponding to the current $I_{LD}$. Note that the voltages $V_{OUTP}$ and $V_{OUTM}$ too are square-wave signals. Thus, the current sense signal output circuit 13 can be understood to generate the current sense signal $S_{OUT}$ based on a square-wave signal corresponding to the voltage $V_{OUTP}$ and a square-wave signal corresponding to the voltage $V_{OUTM}$.

Figure 5:
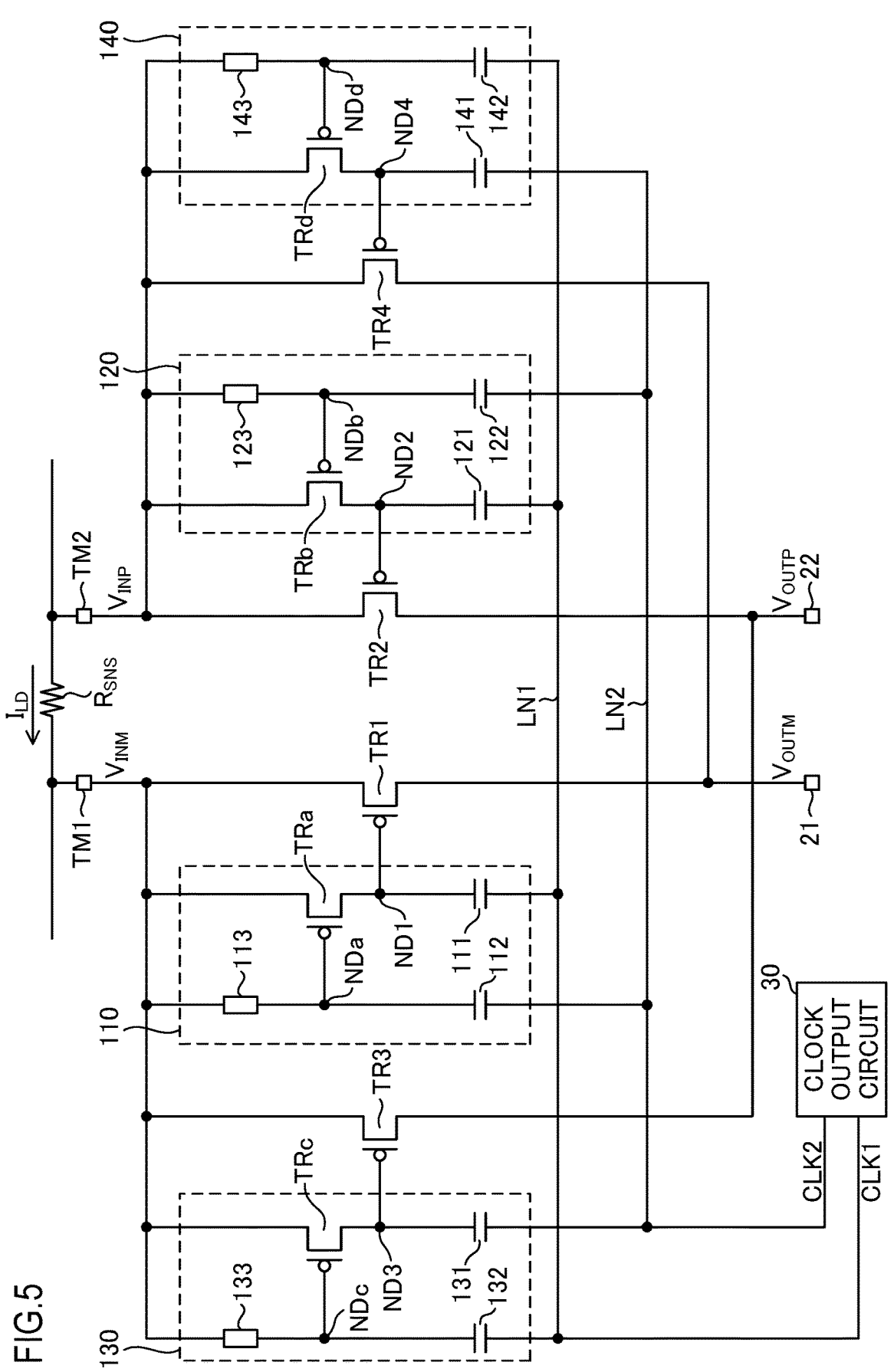
FIG. 5 is a circuit diagram of a part of the current sensor according to the embodiment of the present disclosure that is involved in the generation of a square-wave signal.

FIG. 5 shows an example of a specific circuit of part of the current sensor 10. The switches SW1 to SW4 in FIG. 2 are configured with transistors TR1 to TR4 in FIG. 5 respectively. The switch control circuit 12 in FIG. 2 includes, in addition to the clock output circuit 30, gate signal generation circuits 110 to 140. The clock signal CLK1 output from the clock output circuit 30 is applied to a clock line LN1, and the clock signal CLK2 output from the clock output circuit 30 is applied to a clock line LN2. The clock lines LN1 and LN2 too can be understood to be included among the components of the switch control circuit 12.

The gate signal generation circuits 110 to 140 generate gate signals for the transistors TR1 to TR4 respectively. The gate signal generation circuits 110 to 140 are configured identically with each other. Specifically, the gate signal generation circuit 110 includes a transistor TRa, capacitors 111 and 112, and a resistor 113. The gate signal generation circuit 120 includes a transistor TRb, capacitors 121 and 122, and a resistor 123. The gate signal generation circuit 130 includes a transistor TRc, capacitors 131 and 132, and a resistor 133. The gate signal generation circuit 140 includes a transistor TRd, capacitors 141 and 142, and a resistor 143.

The transistors TR1 to TR4 can be understood to function as main transistors, in which case the transistors TRa to TRd can be understood to function as subsidiary transistors. The transistors TR1 to TR4 and TRa to TRd are P-channel MOSFETs. It is here assumed that the absolute value (e.g., 0.6 V) of the gate threshold voltage Vth of each of the transistors TR1 to TR4 and TRa to TRd is lower than the internal supply voltage Vreg (e.g., 4 V). Accordingly, if the gate potential of the transistor TR1 is lower than the source potential of the transistor TR1 by the voltage Vreg, the transistor TR1 is on. The same description applies to the transistors TR2 to TR4 and TRb to TRd.

The circuit elements shown in FIG. 5 are interconnected as follows.

The source of the transistor TR1 is connected to the terminal TM1, and the drain of the transistor TR1 is connected to the terminal 21. The source of the transistor TRa is connected to the terminal TM1, and the drain of the transistor TRa is connected to a node ND1. The node ND1 is connected to the gate of the transistor TR1 and to the first terminal of the capacitor 111. The second terminal of the capacitor 111 is connected to the clock line LN1. The gate of the transistor TRa is connected to a node NDa. The first terminal of the capacitor 112 is connected to the node NDa, and the second terminal of the capacitor 112 is connected to the clock line LN2. The node NDa is connected via the resistor 113 to the terminal TM1.

The source of the transistor TR2 is connected to the terminal TM2, and the drain of the transistor TR2 is connected to the terminal 22. The source of the transistor TRb is connected to the terminal TM2, and the drain of the transistor TRb is connected to a node ND2. The node ND2 is connected to the gate of the transistor TR2 and to the first terminal of the capacitor 121. The second terminal of the capacitor 121 is connected to the clock line LN1. The gate of the transistor TRb is connected to a node NDb. The first terminal of the capacitor 122 is connected to the node NDb, and the second terminal of the capacitor 122 is connected to the clock line LN2. The node NDb is connected via the resistor 123 to the terminal TM2.

The source of the transistor TR3 is connected to the terminal TM1, and the drain of the transistor TR3 is connected to the terminal 22. The source of the transistor TRc is connected to the terminal TM1, and the drain of the transistor TRc is connected to a node ND3. The node ND3 is connected to the gate of the transistor TR3 and to the first terminal of the capacitor 131. The second terminal of the capacitor 131 is connected to the clock line LN2. The gate of the transistor TRc is connected to a node NDc. The first terminal of the capacitor 132 is connected to the node NDc, and the second terminal of the capacitor 132 is connected to the clock line LN1. The node NDc is connected via the resistor 133 to the terminal TM1.

The source of the transistor TR4 is connected to the terminal TM2, and the drain of the transistor TR4 is connected to the terminal 21. The source of the transistor TRd is connected to the terminal TM2, and the drain of the transistor TRd is connected to a node ND4. The node ND4 is connected to the gate of the transistor TR4 and to the first terminal of the capacitor 141. The second terminal of the capacitor 141 is connected to the clock line LN2. The gate of the transistor TRd is connected to a node NDd. The first terminal of the capacitor 142 is connected to the node NDd, and the second terminal of the capacitor 142 is connected to the clock line LN1. The node NDd is connected via the resistor 143 to the terminal TM2.

Figure 6:
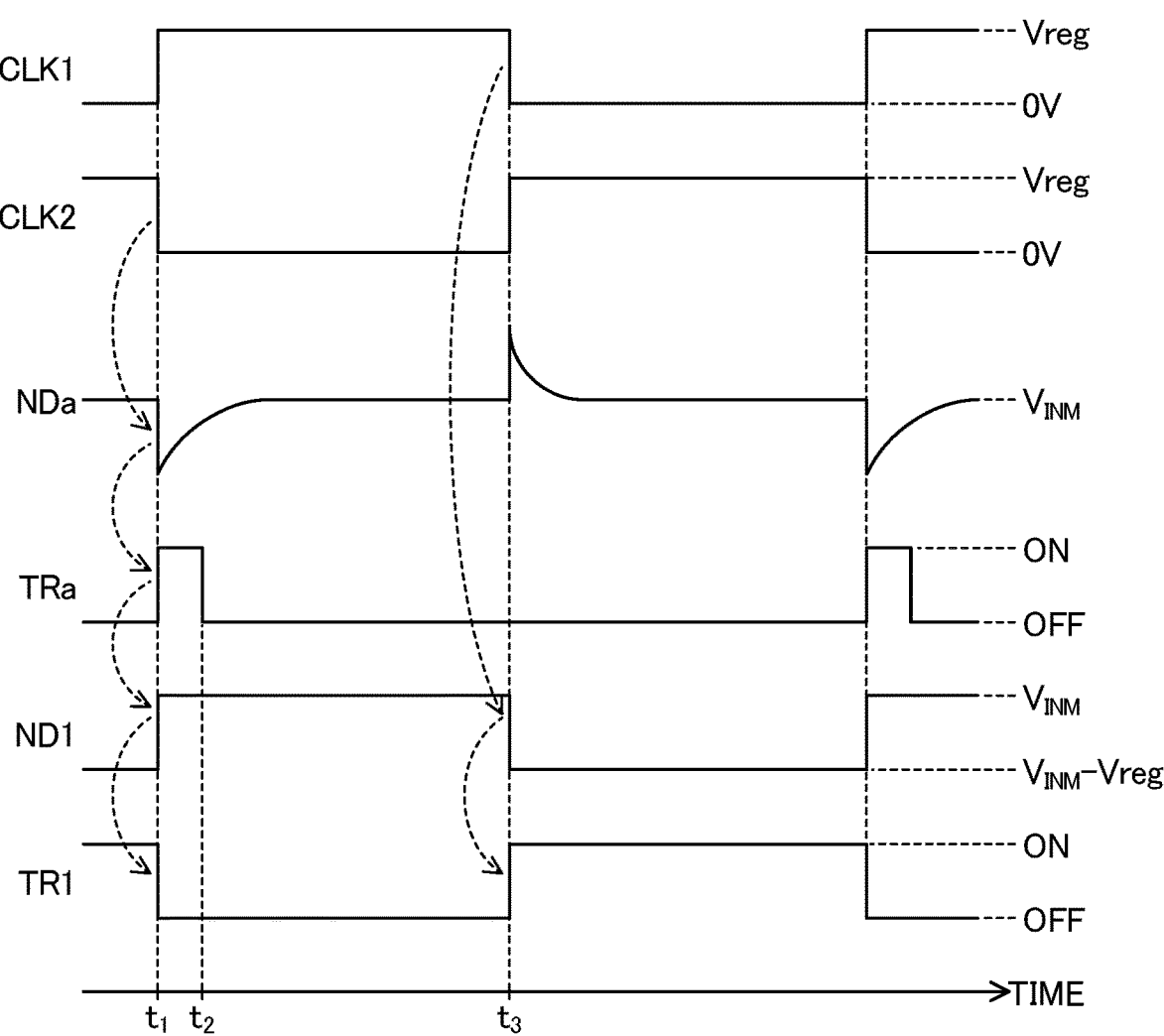
FIG. 6 is a timing chart illustrating the operation of the circuit in FIG. 5.

With reference to FIG. 6, the operation of the transistor TR1 and the gate signal generation circuit 110 will be described. The operation will be described starting with a low-level period of the clock signal CLK1. In the low-level period of the clock signal CLK1, the transistor TRa is off and the transistor TR1 is on. At time point $t_1$, an up edge appears in the clock signal CLK1 and simultaneously a down edge appears in the clock signal CLK2 Immediately before time point $t_1$, the voltage $V_{INM}$ is applied to the node NDa.

The level change in the clock signal CLK2 at time point $t_1$ is transmitted via the capacitor 112 to the node NDa. So, at time point $t_1$, the gate potential of the transistor TRa is lower than the source potential of the transistor TRa by the voltage Vreg, with the result that the transistor TR1 turns on.

When the transistor TRa turns on at time point $t_1$, the voltage at the node ND1 immediately rises substantially to the voltage $V_{INM}$. This rise makes the absolute value of the gate-source voltage of the transistor TR1 lower than the absolute value of the gate threshold voltage Vth, and thus the transistor TR1 turns off. Moreover, after time point $t_1$, as a charge current passes from terminal TM1 via the resistor 113 through the capacitor 112, the potential at the node ND1 rises. When, at time point $t_2$, the absolute value of the gate-source voltage of the transistor TRa becomes lower than the absolute value of the gate threshold voltage Vth, the transistor TRa turns off. It is here assumed that the time lag between time points $t_1$ and $t_2$ is shorter than a half of one period of the clock signal CLK1 or CLK2 (the capacitance value of the capacitor 112 and the resistance value of the resistor 113 are set so as to achieve that).

Time point $t_3$ is a time point that occurs, after time point $t_1$, at the lapse of a half of one period of the clock signal CLK1 or CLK2. After time point $t_1$, immediately before time point $t_3$, the voltage at the node ND1 is substantially equal to the voltage $V_{INM}$. At time point $t_3$, a down edge appears in the clock signal CLK1 and simultaneously an up edge appears in the clock signal CLK2. The level change in the clock signal CLK1 at time point $t_3$ is transmitted via the capacitor 111 to the node ND1. So, at time point $t_3$, the gate potential of the transistor TR1 is lower than the source potential of the transistor TR1 by the voltage Vreg, with the result that the transistor TR1 turns on. After that, every time a down edge appears in the clock signal CLK2, the above-described circuit operation at time point $t_1$ is performed and in addition, every time a down edge appears in the clock signal CLK1, the above-described circuit operation at time point $t_3$ is performed.

Figure 8:
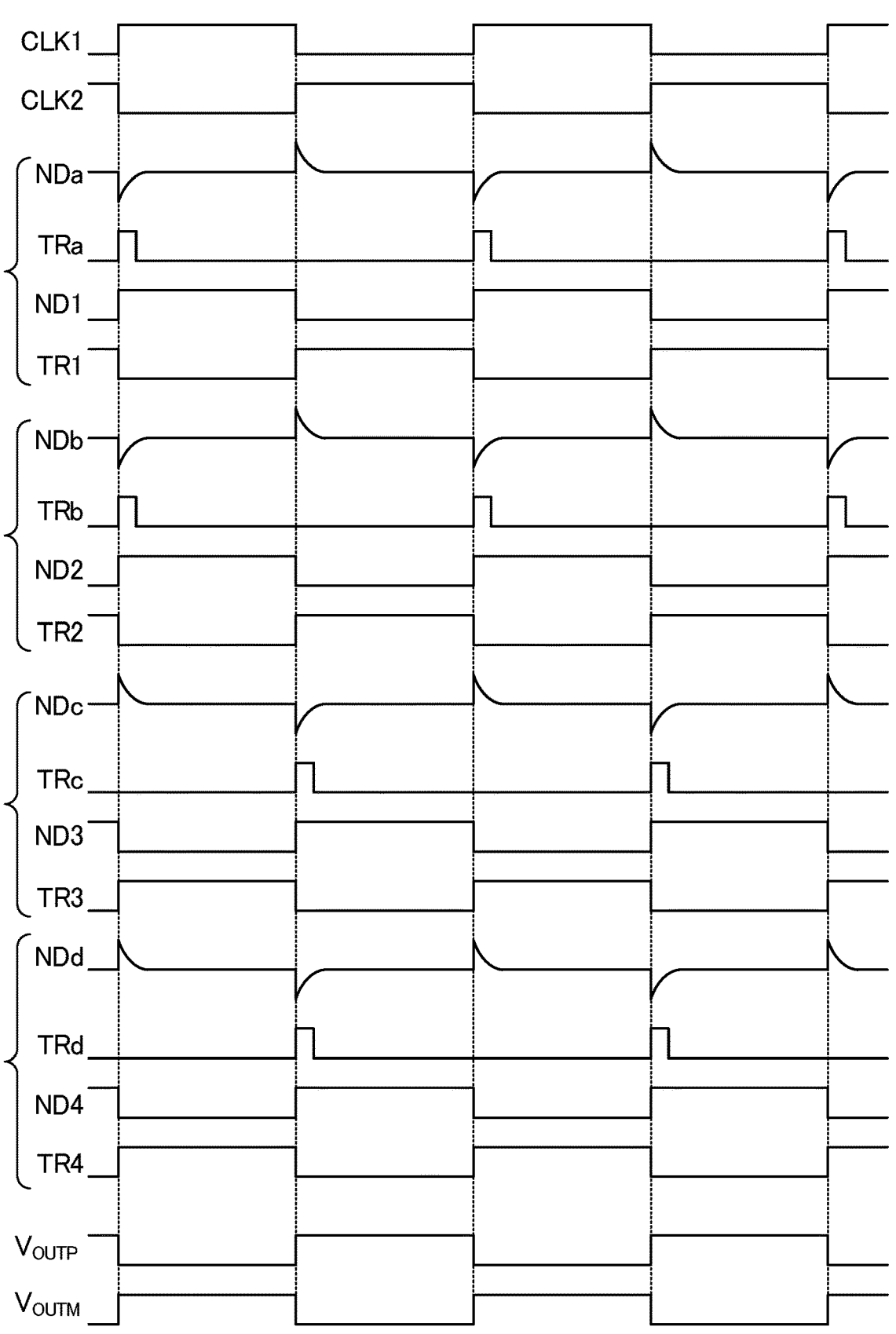
FIG. 8 is a timing chart illustrating the operation of the circuit in FIG. 5.

The operation of the transistor TR2 and the gate signal generation circuit 120 is similar to that of the transistor TR1 and the gate signal generation circuit 110 (see FIG. 8). The description of the operation of the transistor TR1 and the gate signal generation circuit 110 applies to the operation of the transistor TR2 and the gate signal generation circuit 120 with the symbols "TR1", "TRa", "111", "112", "113", "ND1", "NDa", "TM1", and "$V_{INM}$" in the former replaced with the symbols "TR2", "TRb", "121", "122", "123", "ND2", "NDb", "TM2", and "$V_{INP}$" respectively. The on periods of the transistors TR1 and TR2 coincide. In the on period of the transistor TR1, $V_{OUTM}=V_{INM}$ and, in the on period of the transistor TR2, $V_{OUTP}=V_{INP}$.

As described above, at the timing ($t_1$) of a down edge in the clock signal CLK2, the level change in the clock signal CLK2 is transmitted via the capacitors 112 and 122 to the gates of the transistors TRa and TRb respectively so that the transistors TRa and TRb turn on and consequently the transistors TR1 and TR2 turn off. After that, the transistors TRa and TRb turn off (at $t_2$), and then, at the timing ($t_3$) of a down edge in the clock signal CLK1, the level change in the clock signal CLK1 is transmitted via the capacitors 111 and 121 to the gates of the transistors TR1 and TR2 respectively so that the transistors TR1 and TR2 turn on.

Figure 7:
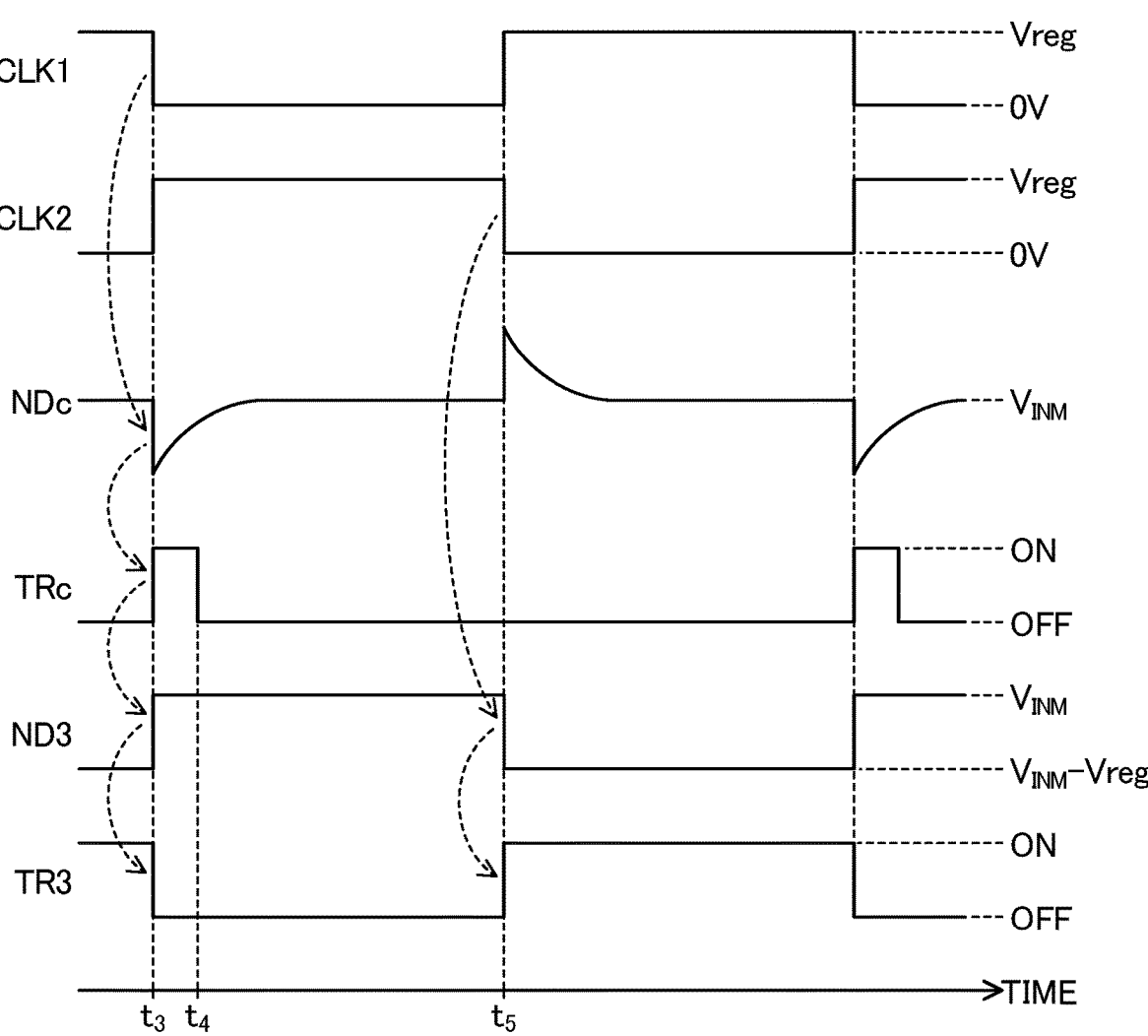
FIG. 7 is a timing chart illustrating the operation of the circuit in FIG. 5.

With reference to FIG. 7, the operation of the transistor TR3 and the gate signal generation circuit 130 will be described. The operation will be described starting with a low-level period of the clock signal CLK2. In the low-level period of the clock signal CLK2, the transistor TRc is off and the transistor TR3 is on. At time point $t_3$, an up edge appears in the clock signal CLK2 and simultaneously a down edge appears in the clock signal CLK1 Immediately before time point $t_3$, the voltage $V_{INM}$ is applied to the node NDc.

The level change in the clock signal CLK1 at time point $t_3$ is transmitted via the capacitor 132 to the node NDc. So, at time point $t_3$, the gate potential of the transistor TRc is lower than the source potential of the transistor TRc by the voltage Vreg, with the result that the transistor TRc turns on.

When the transistor TRc turns on at time point $t_3$, the voltage at the node ND3 immediately rises substantially to the voltage $V_{INM}$. This rise makes the absolute value of the gate-source voltage of the transistor TR3 lower than the absolute value of the gate threshold voltage Vth, and thus the transistor TR3 turns off. Moreover, after time point $t_3$, as a charge current passes from terminal TM1 via the resistor 133 through the capacitor 132, the potential at the node NDc rises. When, at time point $t_4$, the absolute value of the gate-source voltage of the transistor TRc becomes lower than the absolute value of the gate threshold voltage Vth, the transistor TRc turns off. It is here assumed that the time lag between time points $t_3$ and $t_4$ is shorter than a half of one period of the clock signal CLK1 or CLK2 (the capacitance value of the capacitor 132 and the resistance value of the resistor 133 are set so as to achieve that).

Time point $t_5$ is a time point that occurs, after time point $t_3$, at the lapse of a half of one period of the clock signal CLK1 or CLK2. After time point $t_3$, immediately before time point $t_5$, the voltage at the node ND3 is substantially equal to the voltage $V_{INM}$. At time point $t_5$, a down edge appears in the clock signal CLK2 and simultaneously an up edge appears in the clock signal CLK1. The level change in the clock signal CLK2 at time point $t_5$ is transmitted via the capacitor 131 to the node ND3. So, at time point $t_5$, the gate potential of the transistor TR3 is lower than the source potential of the transistor TR3 by the voltage Vreg, with the result that the transistor TR3 turns on. After that, every time a down edge appears in the clock signal CLK1, the above-described circuit operation at time point $t_3$ is performed and in addition, every time a down edge appears in the clock signal CLK2, the above-described circuit operation at time point $t_5$ is performed.

The operation of the transistor TR4 and the gate signal generation circuit 140 is similar to that of the transistor TR3 and the gate signal generation circuit 130 (see FIG. 8). The description of the operation of the transistor TR3 and the gate signal generation circuit 130 applies to the operation of the transistor TR4 and the gate signal generation circuit 140 with the symbols "TR3", "TRc", "131", "132", "133", "ND3", "NDc", "TM1", and "$V_{INM}$" in the former replaced with the symbols "TR4", "TRd", "141", "142", "143", "ND4", "NDd", "TM2", and "$V_{INP}$" respectively. The on periods of the transistors TR3 and TR4 coincide. In the on period of the transistor TR3, $V_{OUTP}=V_{INM}$ and, in the on period of the transistor TR4, $V_{OUTM}=V_{INP}$.

As described above, at the timing ($t_3$) of a down edge in the clock signal CLK1, the level change in the clock signal CLK1 is transmitted via the capacitors 132 and 142 to the gates of the transistors TRc and TRd respectively so that the transistors TRc and TRd turn on and consequently the transistors TR3 and TR4 turn off. After that, the transistors TRc and TRd turn off (at $t_4$), and then, at the timing ($t_4$) of a down edge in the clock signal CLK2, the level change in the clock signal CLK2 is transmitted via the capacitors 131 and 141 to the gates of the transistors TR3 and TR4 respectively so that the transistors TR3 and TR4 turn on.

FIG. 8 shows, in a consolidated form, the waveforms of the signals and voltages at relevant points in FIG. 5 along with the transition of the states of the individual transistors.

Now, a specific numerical example of the current sensor 10 will be presented. The internal supply voltage Vreg is, for example, 4.0 V. If it is assumed that the maximum value that the common-mode voltage $V_{CM}$ can have is 40.0 V and that, with the common-mode voltage $V_{CM}$ actually at 40.0 V, the sense voltage $V_{SNS}$ is 0.1 V, then ($V_{INP}$, $V_{INM}$)=(40.0, 39.9) (in volts).

In this numerical example, adopting a configuration (referred to as the imaginary configuration in the following description) where the transistors constituting the switches SW1 to SW4 are fed with a gate signal that is equal to the internal supply voltage Vreg or 0 V results in a voltage of 36 V or 40 V being applied between the gate and the source of those transistors. That is, with the imaginary configuration, the transistors constituting the switches SW1 to SW4 are required to have a high withstand voltage. Adapting to a high withstand voltage leads to an increased size of the transistors and an increased cost of the current sensor 10.

By contrast, with the configuration shown in FIG. 5, it does not occur that a voltage higher than the internal supply voltage Vreg is applied between the gate and the source of any of the transistors TR1 to TR4 (the same is true also with the transistors TRa to TRd). This permits the use of low-withstand-voltage transistors and is expected to lead to a smaller size of the transistors and a reduced cost of the current sensor 10.

The semiconductor substrate that is connected to the terminals TM1, TM2, 21, and 22 is given a withstand voltage equal to or higher than the common-mode voltage $V_{CM}$. Since the capacitors 23 and 24 are provided between the terminals 21 and 22 and the circuit 13, the components in the circuit 13 only need to have a withstand voltage slightly higher than the internal supply voltage Vreg regardless of the common-mode voltage $V_{CM}$.

In connection with the embodiment described above, some examples of modification will be described below along with applied technologies, supplementary features, and the like.

While the above embodiment assumes that the voltage Vreg is a voltage generated from the supply voltage VDD, the voltage Vreg may instead be the supply voltage VDD itself that is fed from outside the current sensor 10 to the terminal TM4. In that case, the internal power supply circuit 14 can be omitted from the current sensor 10.

While the above description deals with a configuration where the sense resistor $R_{SNS}$ is externally connected to the current sensor 10, the sense resistor $R_{SNS}$ may instead be incorporated in the current sensor 10, While the above description deals with a configuration where the sense resistor $R_{SNS}$ is provided on the high-potential side of the load LD, the sense resistor $R_{SNS}$ may instead be provided on the low-potential side of the load LD.

The current sensor 10 may be incorporated in a vehicle such as an automobile so that the current sensor 10 is applied to any load LD on the vehicle. This however is not meant as any limitation: the current sensor 10 may be employed in any applications other than vehicle onboard use.

For any signal or voltage, the relationship of its high and low levels may be reversed unless inconsistent with what is disclosed herein.

The channel type of any FET (field-effect transistor) mentioned in embodiments is merely illustrative. The channel type of any FET may be changed between P- and N-channel types unless inconsistent with what is disclosed herein.

Embodiments of the present disclosure allow for any modifications as necessary within the scope of technical ideas recited in the appended claims. The embodiments described above are merely examples of implementing the present disclosure, and what is meant by any of the terms used to describe what is disclosed herein and the constituent elements of it is not limited to that mentioned in connection with the embodiments. The specific values mentioned in the above description are merely illustrative and needless to say can be modified to different values.

<<Notes>>

To follow are notes on the present disclosure of which specific configuration examples have been described by way of embodiments above.

According to one aspect of the present disclosure, a current sensor (10; see FIG. 1) includes: a first input terminal (TM1) and a second input terminal (TM2) configured to be capable of having a sense resistor ($R_{SNS}$) connected between them; a square wave generation circuit (11) connected to the first and second input terminals and configured to be capable of generating a square-wave signal with an amplitude proportional to the voltage across the sense resistor; and a current sense signal output circuit (13) configured to be capable of outputting based on the square-wave signal a current sense signal ($S_{OUT}$) corresponding to the current passing through the sense resistor. (A first configuration.)

With a configuration that directly monitors the voltage between the first and second input terminals, the circuit elements that receive the voltage at the first and second input terminals needs to have a withstand voltage equal to or higher than the voltage applied to those input terminals. Adapting to a high withstand voltage leads to an increased size and an increased cost of circuit elements. With a method like that of the first configuration that generates a square-wave signal with an amplitude proportional to the voltage across a sense resistor and that outputs a current sense signal based on the square-wave signal, it is possible to reduce the withstand voltage needed in the circuit elements that receive the voltage at the first and second input terminals.

In the current sensor (see FIG. 2) of the first configuration, the square wave generation circuit includes: a first output terminal (21) and a second output terminal (22); a first switch (SW1) provided between the first input terminal and the first output terminal; a second switch (SW2) provided between the second input terminal and the second output terminal; a third switch (SW3) provided between the first input terminal and the second output terminal; and a fourth switch (SW4) provided between the second input terminal and the first output terminal. The current sensor may further include a switch control circuit (12) configured to generate the square-wave signal between the first and second output terminals by controlling the states of the first to fourth switches. (A second configuration.)

In the current sensor (see FIGS. 3 and 4) of the second configuration, the switch control circuit may be configured to generate the square-wave signal between the first and second output terminals by switching alternately between a first state (ST1) in which the first and second switches are on and the third and fourth switches are off and a second state (ST2) in which the first and second switches are off and the third and fourth switches are on. (A third configuration.)

In the current sensor of the second or third configuration, the first to fourth switches may respectively be a first to a fourth main transistors (TR1 to TR4) that are each configured with a field-effect transistor. The switch control circuit may include: a first subsidiary transistor (TRa) provided between the first input terminal and the gate of the first main transistor; a second subsidiary transistor (TRb) provided between the second input terminal and the gate of the second main transistor; a third subsidiary transistor (TRc) provided between the first input terminal and the gate of the third main transistor; a fourth subsidiary transistor (TRd) provided between the second input terminal and the gate of the fourth main transistor; and a clock output circuit (30) configured to output a first clock signal (CLK1) that is a rectangular-wave signal and a second clock signal (CLK2) that corresponds to an inversion signal of the first clock signal. The switch control circuit may be configured to be capable of turning the main transistors on or off respectively by controlling the gate voltages to the main transistors via the subsidiary transistors by using the first and second clock signals. (A fourth configuration.)

In the current sensor of the fourth configuration, the switch control circuit may include: a first gate signal generation circuit (110) configured to include the first subsidiary transistor; a second gate signal generation circuit (120) configured to include the second subsidiary transistor; a third gate signal generation circuit (130) configured to include the third subsidiary transistor; a fourth gate signal generation circuit (140) configured to include the fourth subsidiary transistor; a first clock line (LN1) to which the first clock signal is applied; and a second clock line (LN2) to which the second clock signal is applied. The gate signal generation circuits may each include a first capacitor, a second capacitor, and a resistor. In the first gate signal generation circuit, the first capacitor (111) may be provided between the gate of the first main transistor and the first clock line, the second capacitor (112) may be provided between the gate of the first subsidiary transistor and the second clock line, and the resistor (113) may be provided between the gate of the first subsidiary transistor and the first input terminal. In the second gate signal generation circuit, the first capacitor (121) may be provided between the gate of the second main transistor and the first clock line, the second capacitor (122) may be provided between the gate of the second subsidiary transistor and the second clock line, and the resistor (123) may be provided between the gate of the second subsidiary transistor and the second input termi- nal. In the third gate signal generation circuit, the first capacitor (131) may be provided between the gate of the third main transistor and the second clock line, the second capacitor (132) may be provided between the gate of the third subsidiary transistor and the first clock line, and the resistor (133) may be provided between the gate of the third subsidiary transistor and the first input terminal. In the fourth gate signal generation circuit, the first capacitor (141) may be provided between the gate of the fourth main transistor and the second clock line, the second capacitor (142) may be provided between the gate of the fourth subsidiary transistor and the first clock line, and the resistor (143) may be provided between the gate of the fourth subsidiary transistor and the second input terminal. (A fifth configuration.)

With the fifth configuration, the voltage applied between electrodes of each transistor can be kept equal to or lower than the potential difference between a first and a second level regardless of the voltage applied to the first or second input terminal. That is, each transistor does not need to have a withstand voltage corresponding to the voltage applied to the first or second input terminal, and this helps reduce the size of each transistor.

In the current sensor of the fifth configuration, the signal levels of the first and second clock signals may each change between a first level and a second level that are different from each other such that a first timing ($t_1$, $t_5$) at which the signal level of the first clock signal changes from the first level to the second level and the signal level of the second clock signal changes from the second level to the first level and a second timing ($t_3$) at which the signal level of the first clock signal changes from the second level to the first level and the signal level of the second clock signal changes from the first level to the second level occur alternately. At the first timing (see $t_1$ in FIG. 6), a level change in the second clock signal may be transmitted via the second capacitor in each of the first and second gate signal generation circuits to the gates of the first and second subsidiary transistors so that the first and second subsidiary transistors turn on and conse- quently the first and second main transistors turn off, the first and second subsidiary transistors thereafter turning off (see $t_2$ in FIG. 6), and then, at the second timing (see $t_3$ in FIG. 6), a level change in the first clock signal may be transmitted via the first capacitor in each of the first and second gate signal generation circuits to the gates of the first and second main transistors so that the first and second main transistors turn on. At the second timing (see $t_3$ in FIG. 7), a level change in the first clock signal may be transmitted via the second capacitor in each of the third and fourth gate signal generation circuits to the gates of the third and fourth subsidiary transistors so that the third and fourth subsidiary transistors turn on and consequently the third and fourth main transistors turn off, the third and fourth subsidiary transistors thereafter turning off (see $t_4$ in FIG. 7), and then, at the first timing (see is in FIG. 7), a level change in the second clock signal may be transmitted via the first capacitor in each of the third and fourth gate signal generation circuits to the gates of the third and fourth main transistors so that the third and fourth main transistors turn on. (A sixth configuration.)

The invention claimed is:

1. A current sensor, comprising:
   a first input terminal and a second input terminal config-
      ured to be capable of having a sense resistor connected
      therebetween;
   a square wave generation circuit connected to the first and
      second input terminals, the square wave generation
      circuit being configured to be capable of generating a
      square-wave signal with an amplitude proportional to a
      voltage across the sense resistor; and a current sense signal output circuit configured to be capable of outputting based on the square-wave signal a current sense signal corresponding to a current passing through the sense resistor, wherein the square wave generation circuit includes:

a first output terminal and a second output terminal;

a first switch provided between the first input terminal and the first output terminal;

a second switch provided between the second input terminal and the second output terminal;

a third switch provided between the first input terminal and the second output terminal; and a fourth switch provided between the second input terminal and the first output terminal, and the current sensor further includes a switch control circuit configured to generate the square-wave signal between the first and second output terminals by controlling states of the first to fourth switches.

2. The current sensor according to claim 1, wherein the switch control circuit is configured to generate the square-wave signal between the first and second output terminals by switching alternately between a first state in which the first and second switches are on and the third and fourth switches are off and a second state in which the first and second switches are off and the third and fourth switches are on.

3. The current sensor according to claim 1, wherein the first to fourth switches are respectively a first to a fourth main transistors that are each configured with a field-effect transistor, the switch control circuit includes:

a first subsidiary transistor provided between the first input terminal and a gate of the first main transistor;

a second subsidiary transistor provided between the second input terminal and a gate of the second main transistor;

a third subsidiary transistor provided between the first input terminal and a gate of the third main transistor;

a fourth subsidiary transistor provided between the second input terminal and a gate of the fourth main transistor; and a clock output circuit configured to output a first clock signal that is a rectangular-wave signal and a second clock signal that corresponds to an inversion signal of the first clock signal, and the switch control circuit is configured to be capable of turning the main transistors on or off respectively by controlling gate voltages to the main transistors via the subsidiary transistors by using the first and second clock signals.

4. The current sensor according to claim 3, wherein the switch control circuit includes:

a first gate signal generation circuit configured to include the first subsidiary transistor;

a second gate signal generation circuit configured to include the second subsidiary transistor;

a third gate signal generation circuit configured to include the third subsidiary transistor;

a fourth gate signal generation circuit configured to include the fourth subsidiary transistor;

a first clock line to which the first clock signal is applied; and a second clock line to which the second clock signal is applied, the gate signal generation circuits each include a first capacitor, a second capacitor, and a resistor, in the first gate signal generation circuit, the first capacitor is provided between the gate of the first main transistor and the first clock line, the second capacitor is provided between a gate of the first subsidiary transistor and the second clock line, and the resistor is provided between the gate of the first subsidiary transistor and the first input terminal, in the second gate signal generation circuit, the first capacitor is provided between the gate of the second main transistor and the first clock line, the second capacitor is provided between a gate of the second subsidiary transistor and the second clock line, and the resistor is provided between the gate of the second subsidiary transistor and the second input terminal, in the third gate signal generation circuit, the first capacitor is provided between the gate of the third main transistor and the second clock line, the second capacitor is provided between a gate of the third subsidiary transistor and the first clock line, and the resistor is provided between the gate of the third subsidiary transistor and the first input terminal, and in the fourth gate signal generation circuit, the first capacitor is provided between the gate of the fourth main transistor and the second clock line, the second capacitor is provided between a gate of the fourth subsidiary transistor and the first clock line, and the resistor is provided between the gate of the fourth subsidiary transistor and the second input terminal.

5. The current sensor according to claim 4, wherein signal levels of the first and second clock signals each change between a first level and a second level that are different from each other such that a first timing at which the signal level of the first clock signal changes from the first level to the second level and the signal level of the second clock signal changes from the second level to the first level and a second timing at which the signal level of the first clock signal changes from the second level to the first level and the signal level of the second clock signal changes from the first level to the second level occur alternately, at the first timing, a level change in the second clock signal is transmitted via the second capacitor in each of the first and second gate signal generation circuits to the gates of the first and second subsidiary transistors so that the first and second subsidiary transistors turn on and consequently the first and second main transistors turn off, the first and second subsidiary transistors thereafter turning off, and then, at the second timing, a level change in the first clock signal is transmitted via the first capacitor in each of the first and second gate signal generation circuits to the gates of the first and second main transistors so that the first and second main transistors turn on, at the second timing, a level change in the first clock signal is transmitted via the second capacitor in each of the third and fourth gate signal generation circuits to the gates of the third and fourth subsidiary transistors so that the third and fourth subsidiary transistors turn on and consequently the third and fourth main transistors turn off, the third and fourth subsidiary transistors thereafter turning off, and then, at the first timing, a level change in the second clock signal is transmitted via the first capacitor in each of the third and fourth gate signal generation circuits to the gates of the third and fourth main transistors so that the third and fourth main transistors turn on.

* * * * *